United States Patent
Lai

(10) Patent No.: US 10,917,981 B2
(45) Date of Patent: Feb. 9, 2021

(54) ADJUSTABLE EMBEDDED DISPLAY UNIT BACKFRAME

(71) Applicant: APLEX TECHNOLOGY INC., New Taipei (TW)

(72) Inventor: Jui-Chieh Lai, New Taipei (TW)

(73) Assignee: APLEX TECHNOLOGY INC., New Taipei (TW)

(*) Notice: Subject to any disclaimer, the term of this patent is extended or adjusted under 35 U.S.C. 154(b) by 0 days.

(21) Appl. No.: 16/425,988

(22) Filed: May 30, 2019

(65) Prior Publication Data

US 2020/0383218 A1 Dec. 3, 2020

(51) Int. Cl.
*H05K 5/02* (2006.01)
*F16M 13/02* (2006.01)
*H05K 5/00* (2006.01)

(52) U.S. Cl.
CPC ......... *H05K 5/0204* (2013.01); *F16M 13/022* (2013.01); *H05K 5/0017* (2013.01); *H05K 5/0221* (2013.01)

(58) Field of Classification Search
CPC .. H05K 5/0204; H05K 5/0017; H05K 5/0221; F16M 13/022; F16M 11/041; F16M 13/02; Y10S 248/924; B60K 2370/81; B60K 2370/816; H02B 1/044; Y10T 403/32451; B25B 5/106; B60R 11/0252; A47G 1/164; F16B 7/105
USPC ...... 248/670, 675, 680, 681, 488, 924, 27.1, 248/27.3, 496, 917, 229.22, 229.13, 248/229.14, 228.3, 228.5, 231.41, 231.61, 248/245, 678, 117.4, 117.6, 117.5, 500, 248/510, 346.03, 346.07, 346.06, 544, 248/551, 231.91, 231.9, 558, 911, 912; 361/679.21, 679.01; 312/242; 52/27
See application file for complete search history.

(56) References Cited

U.S. PATENT DOCUMENTS

| 1,350,970 | A | * | 8/1920 | Hutchison | ............... | B66F 13/00 |
| | | | | | | 248/346.03 |
| 2,713,471 | A | * | 7/1955 | Hirsch | ..................... | H04M 1/11 |
| | | | | | | 248/346.03 |
| 3,052,369 | A | * | 9/1962 | Taibi | ..................... | H02G 3/123 |
| | | | | | | 220/3.6 |
| 3,169,007 | A | * | 2/1965 | Duffy | ...................... | H05K 7/12 |
| | | | | | | 248/343 |

(Continued)

FOREIGN PATENT DOCUMENTS

TW 528046 U * 9/2016

Primary Examiner — Kimberly T Wood
(74) Attorney, Agent, or Firm — Schmeiser, Olsen & Watts, LLP

(57) ABSTRACT

An adjustable embedded display unit backframe includes a backframe base and a plurality of engaging assemblies. The backframe base has a front for holding a display screen and a back opposing the front. The back has a plurality of slide rails. The engaging assemblies are disposed in the slide rails, respectively, and slidable relative to the backframe base. The engaging assemblies each have an engaging component for engaging with a wall. With the engaging assemblies being slidable relative to the backframe base, the adjustable embedded display unit backframe is suitable for different sizes of the opening bored in the wall, not only sparing the hassle of boring an opening in the wall anew, but also ensuring that the use of the adjustable embedded display unit backframe is easy and flexible.

6 Claims, 5 Drawing Sheets

(56) References Cited

U.S. PATENT DOCUMENTS

| | | | | |
|---|---|---|---|---|
| 4,250,540 | A * | 2/1981 | Kristofek | F21V 21/04 |
| | | | | 248/27.1 |
| 6,585,212 | B2 * | 7/2003 | Carnevali | B60R 11/02 |
| | | | | 248/316.4 |
| 6,644,615 | B1 * | 11/2003 | Liu | B66F 13/00 |
| | | | | 248/346.07 |
| 7,611,112 | B2 * | 11/2009 | Lin | B60R 11/02 |
| | | | | 248/274.1 |
| 7,673,842 | B2 * | 3/2010 | Nevers | F21V 21/045 |
| | | | | 248/343 |
| 7,984,886 | B2 * | 7/2011 | Lin | B60R 11/0252 |
| | | | | 248/181.1 |
| 8,264,827 | B2 * | 9/2012 | Yuan | F16B 5/0642 |
| | | | | 248/229.12 |
| 8,550,013 | B2 * | 10/2013 | Carnevali | F16B 7/14 |
| | | | | 108/137 |
| 8,864,089 | B2 * | 10/2014 | Hung | F16M 11/041 |
| | | | | 248/122.1 |
| 9,483,079 | B2 * | 11/2016 | Huang | G06F 1/1637 |
| 2011/0062299 | A1 * | 3/2011 | Tsai | F16M 11/041 |
| | | | | 248/231.41 |
| 2012/0193496 | A1 * | 8/2012 | Li | F16M 13/00 |
| | | | | 248/316.1 |

\* cited by examiner

ADJUSTABLE EMBEDDED DISPLAY UNIT BACKFRAME

BACKGROUND OF THE INVENTION

1. Field of the Invention

The present disclosure relates to display unit backframes, and in particular to an adjustable embedded display unit backframe.

2. Description of the Related Art

According to the prior art illustrated by FIG. 1, a conventional embedded display unit is mounted in place in the way described below. An opening corresponding in size and shape to a backframe B is bored in a wall W. The backframe B is embedded in the wall W in such a manner to allow a display screen D to face outward. However, if the opening initially bored in the wall W is found to be smaller than the backframe B in terms of dimensions, the wall W must be bored anew. If the opening initially bored in the wall W is found to be larger than the backframe B in terms of dimensions, the backframe B cannot be embedded in the wall W. As a result, it is neither easy nor flexible to mount the conventional embedded display unit in place.

BRIEF SUMMARY OF THE INVENTION

In view of the aforesaid drawbacks of the prior art, it is important to provide an adjustable embedded display unit backframe which is easy to mount in place and flexible in terms of its mounting requirements.

To achieve at least the above objective, the present disclosure provides an adjustable embedded display unit backframe, comprising: a backframe base having a front for holding a display screen and a back opposing the front, the back having a plurality of slide rails; and a plurality of engaging assemblies disposed in the slide rails, respectively, slidable relative to the backframe base, and each having an engaging component for engaging with a wall.

Regarding the adjustable embedded display unit backframe, the engaging assemblies each comprise a sliding component, bottom ends of the sliding components are disposed in the slide rails, respectively, and one end of each said engaging component is pivotally connected to a corresponding one of the sliding components, thereby allowing the engaging component to rotate relative to the sliding component.

Regarding the adjustable embedded display unit backframe, wherein the slide rail comprises a limiting rail, the limiting rail being disposed on the back and having a plurality of engaging recesses, the engaging recesses being spaced apart by a fixed distance, allowing the sliding component to slide along the limiting rail such that a bottom end of the sliding component engages with one of the engaging recesses.

Regarding the adjustable embedded display unit backframe, the bottom end of the sliding component has a leaf spring for engaging with one of the engaging recesses.

Regarding the adjustable embedded display unit backframe, the leaf spring comprises a resilient arm and a latch portion, the resilient arm connects to the latch portion, and the latch portion engages with one of the engaging recesses.

Regarding the adjustable embedded display unit backframe, the sliding component further comprises a bolt, a fastening element and a nut element such that the fastening element, the engaging component and the nut element are screwed to the bolt consecutively.

Regarding the adjustable embedded display unit backframe, the slide rail has two mounting openings and two rails, the rails are in communication with the mounting openings, respectively, the engaging recesses are disposed between the rails, two wing portions of a bottom end of the fastening element correspond in shape to the mounting openings, respectively, and are perpendicular to two arm portions of the fastening element, respectively, and the widths of the two arm portions are suitable for the rails, respectively.

Regarding the adjustable embedded display unit backframe, the engaging assemblies are in the number of four.

Regarding the adjustable embedded display unit backframe, the number of the slide rails is greater than the number of the engaging assemblies.

Therefore, the adjustable embedded display unit backframe of the present disclosure is suitable for different sizes of the opening bored in the wall, not only sparing the hassle of boring an opening in the wall anew, but also ensuring that the use of embedded display units is easy and flexible.

DETAILED DESCRIPTION OF THE INVETION

To facilitate understanding of the object, characteristics and effects of this present disclosure, embodiments together with the attached drawings for the detailed description of the present disclosure are provided.

Figure 1:
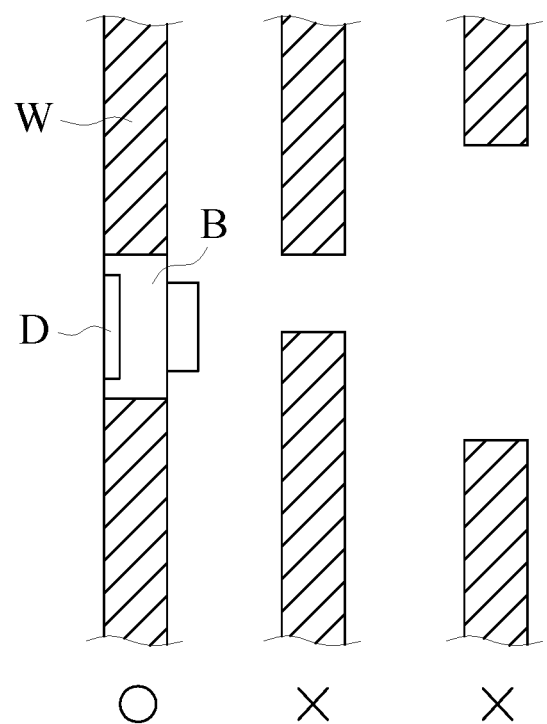
FIG. 1 (PRIOR ART) is a cross-sectional view of an embedded display unit.
Figure 2:
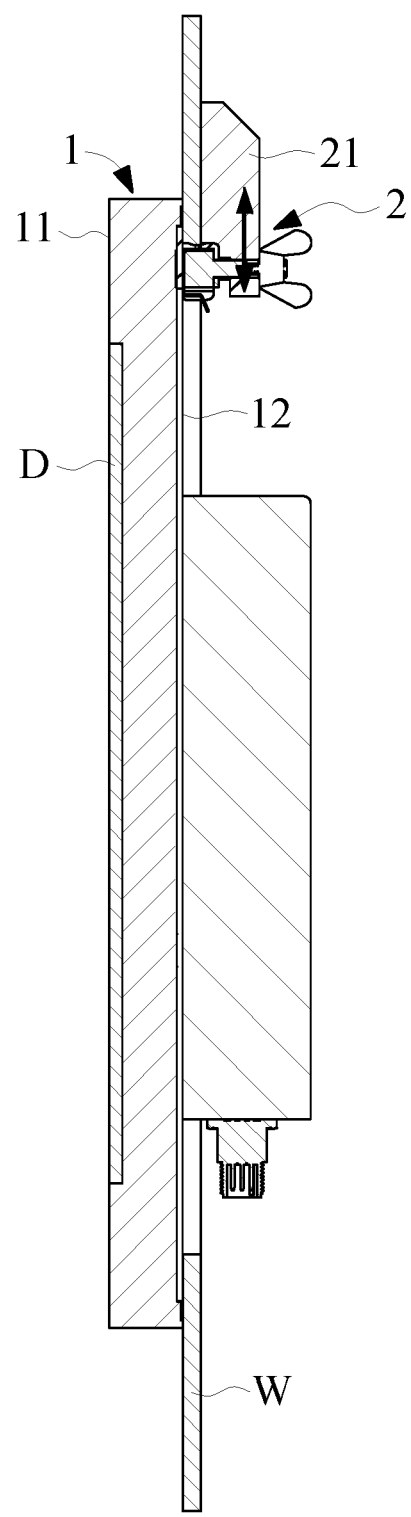
FIG. 2 is a cross-sectional view of an adjustable embedded display unit backframe according to a preferred embodiment of the present disclosure.
Figure 3A:
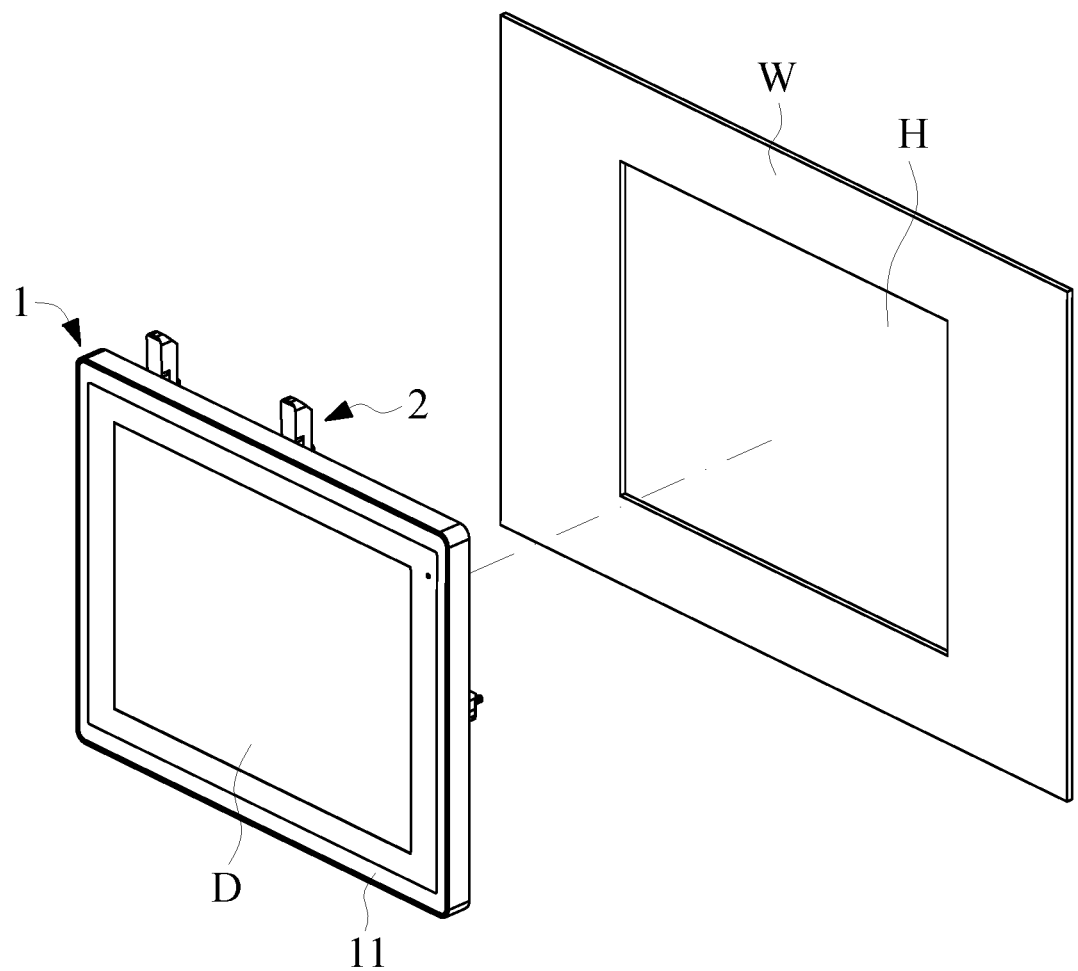
FIG. 3A is a front side perspective view of the adjustable embedded display unit backframe according to the preferred embodiment of the present disclosure.
Figure 3B:
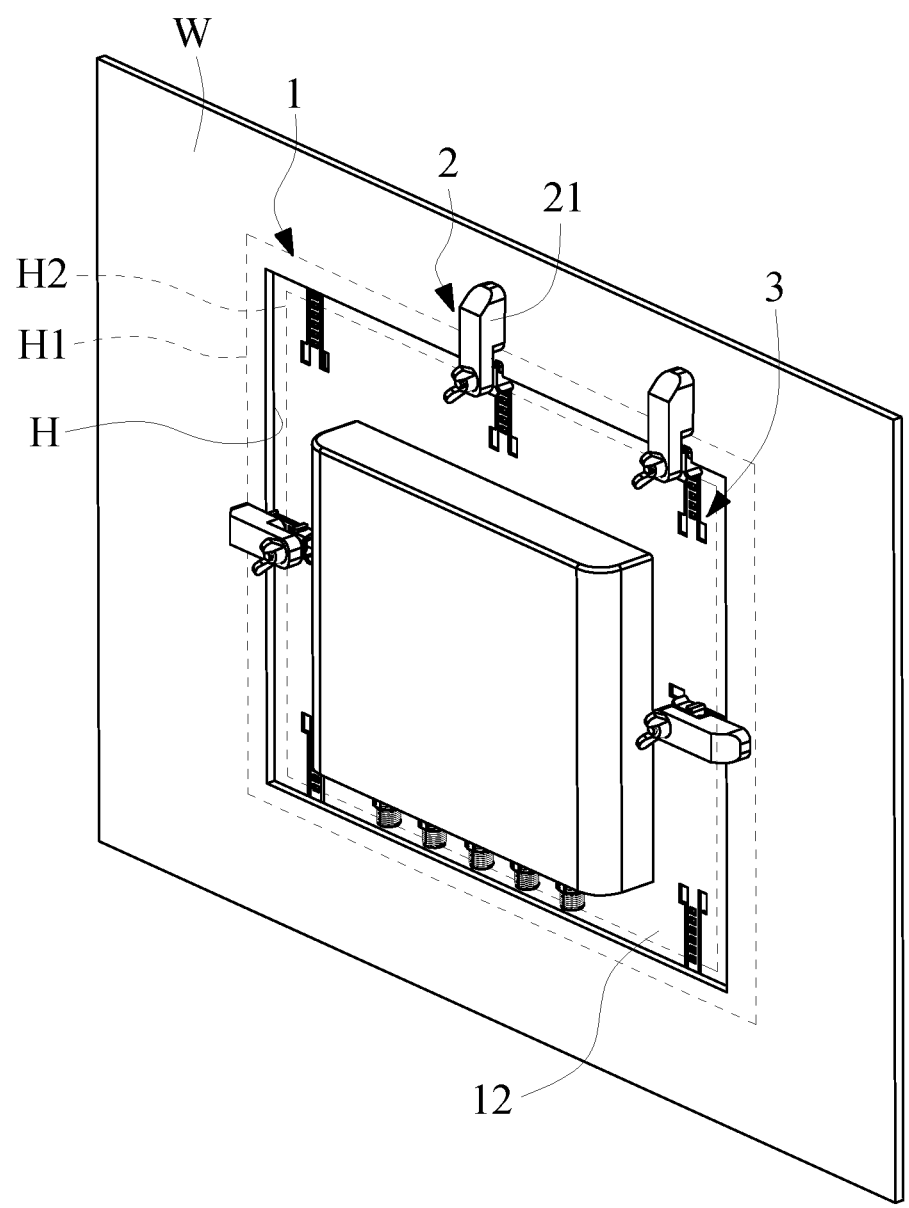
FIG. 3B is a back side perspective view of the adjustable embedded display unit backframe according to the preferred embodiment of the present disclosure.
Figure 4:
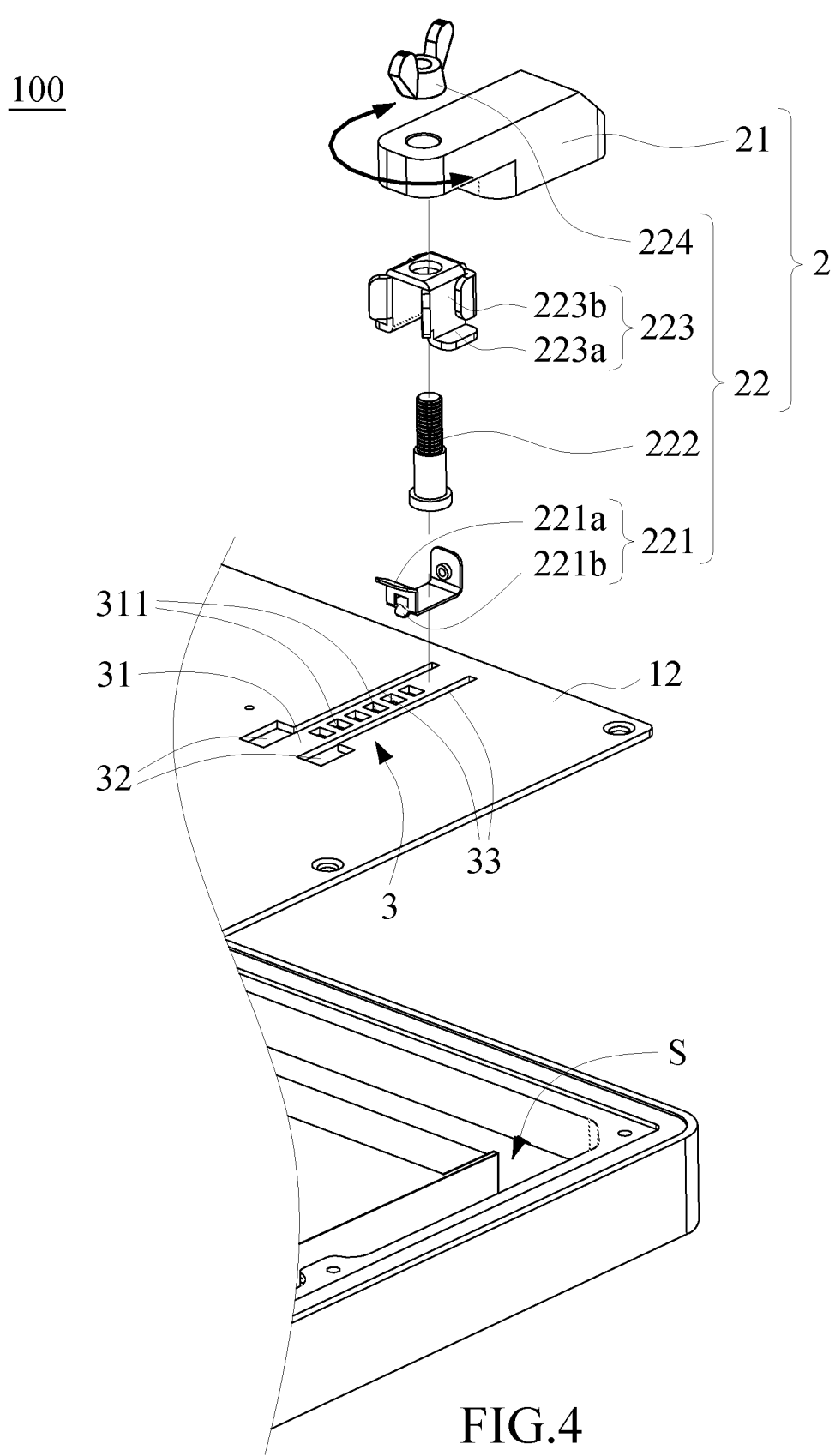
FIG. 4 is a partial exploded view of the adjustable embedded display unit backframe according to the preferred embodiment of the present disclosure.

Referring to FIG. 2 through FIG. 4, the present disclosure provides an adjustable embedded display unit backframe 100 which comprises a backframe base 1 and a plurality of engaging assemblies 2.

Referring to FIG. 3A and FIG. 3B, the backframe base 1 has a front 11 for holding a display screen D and a back 12 opposing the front 11. The back 12 has a plurality of slide rails 3. In this embodiment, the back 12 of the backframe base 1 is rectangular, but the present disclosure is not limited thereto. In a variant embodiment of the present disclosure, the back 12 is square or is of any shape suitable for a wall W.

The engaging assemblies 2 are disposed in the slide rails 3, respectively, and slidable relative to the backframe base 1. The engaging assemblies 2 each have an engaging component 21 for engaging with the wall W. The wall W has an opening H. The opening H may be smaller than the embedded display unit backframe 100 in terms of size, but the smaller opening H does not place any limitation on the mounting process of the embedded display unit backframe 100. To mount the embedded display unit backframe 100 in place, as shown in FIG. 3A, a user holds the backframe base 1 in such a manner that the back 12 faces the wall W. Afterward, as shown in FIG. 3B, the user pushes the backframe base 1 in such a manner that the back 12 presses against the wall W while adjusting the engaging components 21, so as for the engaging components 21 to be exposed from the opening H and thus engaged with the wall W. In this embodiment, as shown in FIG. 2, the engaging components 21 are each L-shaped such that the wall W is clamped by the backframe base 1 and the engaging components 21, but the present disclosure is not limited thereto. In a variant embodiment of the present disclosure, the engaging components 21 are of any type, shape or mechanism and are any standard means such that the backframe base 1 can be connected and fixed to the wall W by the engaging components 21.

Referring to FIG. 3B, since the engaging assemblies 2 are each slidable relative to the backframe base 1 and thus adjustable in position, the adjustable embedded display unit backframe 100 is suitable for the wall W with an opening of any size, sparing the hassle of boring an opening in the wall W anew in an attempt to suit the backframe base 1. Referring to FIG. 3B, the opening of the wall W is of size H, size H1 larger than size H, or size H2 smaller than size H; however, regardless of the size of the opening of the wall W, the user can mount the embedded display unit backframe 100 on the wall W by sliding the engaging assemblies 2, thereby not only sparing the hassle of boring an opening in the wall W anew, but also ensuring that the use of embedded display units is easy and flexible.

Furthermore, in an embodiment, as shown in FIG. 4, the engaging assemblies 2 each comprise a sliding component 22. The bottom ends of the sliding components 22 are disposed in the slide rails 3, respectively. One end of each engaging component 21 is pivotally connected to a corresponding one of the sliding components 22, allowing the engaging component 21 to rotate relative to the sliding component 22. Therefore, to engage the engaging assemblies 2 with the wall W, the user rotates the engaging components 21 until the engaging components 21 face the center of the backframe base 1. After the backframe base 1 has been positioned in place, the user rotates the engaging components 21 such that the engaging components 21 engage with the wall W.

Furthermore, in an embodiment, as shown in FIG. 4, the slide rail 3 comprises a limiting rail 31. A hollow space S is disposed between the slide rail 3 and the body of the backframe base 1. The limiting rail 31 is disposed on the back 12 and has a plurality of engaging recesses 311. The engaging recesses 311 are spaced apart by a fixed distance. The sliding component 21 slides along the limiting rail 31. The bottom end of the sliding component 21 engages with one of the engaging recesses 311. Therefore, the engaging assemblies 2 not only slide along the slide rails 3 but are also selectively confined to one of the slide rails 3.

Furthermore, in an embodiment, as shown in FIG. 4, the bottom end of the sliding component 22 has a leaf spring 221 for engaging with one of the engaging recesses 311. The leaf spring 221 is resilient and thus deforms temporarily under an applied force to therefore escape from the engaging recess 311. As soon as the applied force perishes (for example, when the engaging assemblies 2 have been slid to an ideal position), the leaf spring 221 restores its original form and thus engages with the nearest engaging recess 311. Therefore, the engaging assemblies 2 can be easily, efficiently moved and fixed in place.

Furthermore, in an embodiment, as shown in FIG. 4, the leaf spring 221 comprises a resilient arm 221a and a latch portion 221b. The resilient arm 221a connects to the latch portion 221b. The latch portion 221b engages with one of the engaging recesses 311. Therefore, the latch portion 221b will be separated from the engaging recesses 311 temporarily, provided that a force is applied to the resilient arm 221a. As soon as the applied force perishes, the latch portion 221b restores its original form and thus engages with one of the engaging recesses 311.

Furthermore, in an embodiment, as shown in FIG. 4, each sliding component 22 further comprises a bolt 222, a fastening element 223 and a nut element 224. The fastening element 223, engaging component 21 and nut element 224 are screwed to the bolt 222 consecutively. The fastening element 223 and the leaf spring 221 are fastened to each other.

Furthermore, in an embodiment, as shown in FIG. 4, the limiting rail 31 has two mounting openings 32 and two rails 33. The two rails 33 are in communication with the two mounting openings 32, respectively. The engaging recesses 311 are disposed between the two rails 33. Two wing portions 223a at the bottom end of the fastening element 223 correspond in shape to the two mounting openings 32, respectively. The fastening element 223 further has two arm portions 223b perpendicular to the two wing portions 223a, respectively. The widths of the two arm portions 223b are suitable for the two rails 33, respectively. Therefore, after the fastening element 223, bolt 222 and leaf spring 221 have been mounted in place, the wing portions 223a of the fastening element 223 pass through the mounting openings 32 so as to enter the slide rail 3; meanwhile, the arm portions 223b slide within the rails 33 and get engaged with the limiting rail 31 because of the structure thereof.

Furthermore, in an embodiment, as shown in FIG. 3B, the engaging assemblies 2 are in the number, but the present disclosure is not limited thereto. In a variant embodiment of the present disclosure, the number and position of the engaging assemblies 2 are subject to changes, depending on the requirements for the backframe base 1 and the wall W.

Furthermore, in an embodiment, as shown in FIG. 3B, the number of the slide rails 3 is greater than or equal to the number of the engaging assemblies 2. Hence, the back 12 has the slide rails 3, and the engaging assemblies 2 are mounted on one/some of the slide rails 3 as needed. Therefore, the use of the engaging assemblies 2 is more flexible.

While the present disclosure has been described by means of specific embodiments, numerous modifications and variations could be made thereto by those skilled in the art without departing from the scope and spirit of the present disclosure set forth in the claims.

What is claimed is:

1. An adjustable embedded display unit backframe, comprising:
   a backframe base having a front for holding a display screen and a back opposing the front, the back having a plurality of slide rails; and
   a plurality of engaging assemblies disposed in the slide rails, respectively, slidable relative to the backframe base, and each having a sliding component and an engaging component for engaging with a wall, wherein the bottom ends of the sliding components are disposed in the slide rails, respectively, and one end of each said engaging component is pivotally connected to a corresponding one of the sliding components, thereby allowing the engaging component to rotate relative to the sliding component;

wherein the slide rail comprises a limiting rail, the limiting rail is disposed on the back and has a plurality of engaging recesses, the engaging recesses are spaced apart by a fixed distance, and allow the sliding component to slide along the limiting rail;

wherein a leaf spring is disposed at a bottom end of the sliding component for engaging with one of the engaging recesses.

2. The adjustable embedded display unit backframe of claim 1, wherein the leaf spring comprises a resilient arm and a latch portion, the resilient arm connects to the latch portion, and the latch portion engages with one of the engaging recesses.

3. The adjustable embedded display unit backframe of claim 1, wherein the sliding component further comprises a bolt, a fastening element and a nut element such that the fastening element, the engaging component and the nut element are screwed to the bolt consecutively.

4. The adjustable embedded display unit backframe of claim 3, wherein the slide rail has two mounting openings and two rails, the rails are in communication with the mounting openings, respectively, the engaging recesses are disposed between the rails, two wing portions of a bottom end of the fastening element correspond in shape to the mounting openings, respectively, and are perpendicular to two arm portions of the fastening element, respectively, and the widths of the two arm portions are suitable for the rails, respectively.

5. The adjustable embedded display unit backframe of claim 1, wherein the engaging assemblies are in the number of four.

6. The adjustable embedded display unit backframe of claim 1, wherein the number of the slide rails is greater than the number of the engaging assemblies.

* * * * *